United States Patent
Münker et al.

(10) Patent No.: US 7,154,342 B2
(45) Date of Patent: Dec. 26, 2006

(54) PHASE LOCKED LOOP CIRCUIT WITH A TUNABLE OSCILLATOR AND AN INDEPENDENT FREQUENCY CONVERTER AND FREQUENCY COUNTER

(75) Inventors: Christian Münker, München (DE); Markus Scholz, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/212,422

(22) Filed: Aug. 26, 2005

(65) Prior Publication Data
US 2006/0049887 A1    Mar. 9, 2006

Related U.S. Application Data

(63) Continuation of application No. PCT/DE04/00304, filed on Feb. 18, 2004.

(30) Foreign Application Priority Data
Feb. 27, 2003  (DE) ................. 103 08 643

(51) Int. Cl.
H03L 7/06 (2006.01)
H03L 7/099 (2006.01)
H03L 7/18 (2006.01)

(52) U.S. Cl. .................. 331/11; 331/16; 331/25; 331/36 C; 331/179

(58) Field of Classification Search ............. 331/1 A, 331/10, 11, 16–18, 25, 36 C, 44, 177 V, 179
See application file for complete search history.

(56) References Cited

U.S. PATENT DOCUMENTS

| | | | |
|---|---|---|---|
| 5,182,528 A | 1/1993 | Zuta | |
| 5,382,921 A * | 1/1995 | Estrada et al. | 331/1 A |
| 5,648,744 A | 7/1997 | Prakash et al. | |
| 6,111,471 A | 8/2000 | Bonneau et al. | |
| 6,114,920 A * | 9/2000 | Moon et al. | 331/179 |
| 6,512,419 B1 | 1/2003 | Adams et al. | |
| 6,563,387 B1 * | 5/2003 | Hirano et al. | 331/11 |
| 6,686,804 B1 * | 2/2004 | Adams et al. | 331/17 |
| 6,744,324 B1 * | 6/2004 | Adams et al. | 331/17 |
| 6,806,781 B1 * | 10/2004 | Bisanti et al. | 331/36 R |
| 6,903,613 B1 * | 6/2005 | Mitchell et al. | 331/11 |
| 7,023,285 B1 * | 4/2006 | Nord et al. | 331/16 |

FOREIGN PATENT DOCUMENTS

| | | |
|---|---|---|
| EP | 1 189 347 A1 | 3/2002 |
| JP | 2002314414 A | 10/2002 |

(Continued)

OTHER PUBLICATIONS

"A Family of Low-Power Truly Modular Programmable Dividers in Standard 0.35-μm CMOS Technology", Cicero S. Vaucher, Igor Ferencic, Matthias Locher, Sebastian Sedvallson, Urs Voegeli and Zhenhua Wang, IEEE Journal of Solid-State Circuits, vol. 35, No. 7, Jul. 2000, pp. 1039-1045.

(Continued)

Primary Examiner—David Mis
(74) Attorney, Agent, or Firm—Eschweiler & Associates, LLC

(57) ABSTRACT

A phase regulating arrangement or circuit is disclosed, in which, in addition to a frequency divider, which is arranged in the feedback path of the PLL and, provision is made of a further frequency counter. The frequency counter is configured to be readable and is likewise connected to the oscillator output. The frequency counter drives a control unit that selects a desired frequency band of a multiband oscillator. The phase regulating arrangement or circuit described enables very fast settling in conjunction with low phase noise and good integration possibilities.

13 Claims, 3 Drawing Sheets

FOREIGN PATENT DOCUMENTS

| WO | WO 03/044961 A2 | 5/2003 |
|---|---|---|
| WO | WO 2004/048000 A2 | 6/2004 |
| WO | WO 2004/049573 A2 | 6/2004 |

OTHER PUBLICATIONS

"RF-CMOS Oscillators with Switched Tuning", A. Kral, F. Behbahani and A.A. Abidi, Custom IC Converence, Santa Clara, Ca. May 1998, pp. 555-558.

"A Fully Integrated CMOS Frequency Synthesizer With Charge-Averaging Charge Pump and Dual-Path Loop Filter for PCS- and Cellular-CDMA Wireless Systems", Yido Koo, Hyungki Huh, Yongsik Cho, Jeongwoo Lee, Joonbae Park, Kyeongho Lee, Deog-Kyoon Jeong and Wonchan Kim, IEEE Journal of Solid-State Circuits, vol. 37, No. 5, May 2002, 6 pgs.

International Search Report, Int'l. Application No. PCT/DE2004/000304, Int'l filing Date Feb. 18, 2004, 3 pgs.

* cited by examiner

PHASE LOCKED LOOP CIRCUIT WITH A TUNABLE OSCILLATOR AND AN INDEPENDENT FREQUENCY CONVERTER AND FREQUENCY COUNTER

REFERENCE TO RELATED APPLICATIONS

This application is a continuation of PCT/DE2004/000304 filed Feb. 18, 2004 which was not published in English, that claims the benefit of the priority date of German Patent Application No. DE 103 08 643.9, filed on Feb. 27, 2003, the contents of which both are herein incorporated by reference in their entireties.

FIELD OF THE INVENTION

The present invention relates to a phase regulating arrangement.

BACKGROUND OF THE INVENTION

A phase regulating arrangement of the generic type is shown, for example, in the document U.S. Pat. No. 5,648,744. Said document shows an oscillator having a plurality of frequency bands which can be enabled and disabled and can each be tuned. In this case, the subband is selected by measuring the voltage at the loop filter, that is to say at the input of the oscillator and at the output of the phase detector, and increasing or decreasing the frequency band if certain limits are undershot or overshot.

Phase regulating circuits are also referred to as PLLs (Phase-Locked Loops).

In this case, following frequency division, a phase detector is normally used to compare the output signal of an oscillator with a reference signal, and a loop filter is used to tune the controllable oscillator in a manner dependent on the phase comparison.

Such phase-locked control loops are usually used to synthesize signals at a desired frequency or, for example, to recover a clock signal from a data stream. Phase-locked loops can also be advantageously used in mobile radio for the purposes of signal modulation.

The oscillator of the phase-locked loop is normally of voltage-controlled design in the form of a so-called VCO (Voltage-Controlled Oscillator) which generates an output frequency $f_{VCO}$ that is dependent on an input control voltage $V_c$. This voltage is also referred to as the tuning voltage. The quotient of the change in the output frequency $\Delta f_{VCO}$ with respect to the change in the control voltage $\Delta V_C$ is referred to as the slope $K_V$ of the oscillator and determines the characteristic curve of the latter. The slope may therefore be described by the formula:

$$K_V = \frac{\Delta f_{vco}}{\Delta V_C}.$$

The output frequency of a VCO is composed of a variable component $f_{var}$, which is determined by the slope and the control voltage, and a fixed component, the so-called fundamental frequency $f_B$, which is determined by the dimensioning of the VCO. The output frequency $f_{VCO}$ therefore results from the equation:

$$f_{VCO} = f_B + f_{VAR} = f_B + K_V * V_C.$$

Since the fundamental frequency is subject to severe fluctuations owing to manufacturing tolerances and process variations during production of the VCO using integrated circuit technology, the variable component $f_{var}$ must be large enough to be able to achieve all of the target frequencies despite the tolerances of the fundamental frequency. This may, of course, be ensured with a sufficiently large $K_V$, that is to say with a steep slope, but has the disadvantage that it increases the sensitivity of the PLL to noise and sidetones. This is problematic, in particular, in large scale integrated circuits since interference from other circuit blocks may be coupled over into the VCO via common supply voltages and a common substrate.

One solution to this problem is achieved, in the prior art document mentioned initially, by providing a VCO having subbands which can be changed over and can each be tuned. In this case, the desired frequency range is covered with a plurality of frequency bands instead of with only one single frequency band. In this case, in a first step, the VCO is set in such a manner that the desired frequency is approximately achieved. In a second step, the tuning voltage $V_C$ is then used to pull the VCO to the exact frequency within a selected subband. This results in the advantage that the slope of the VCO is relatively gentle within the individual subbands, with the result that the above-described problems of noise and coupling-over are avoided. This solution is particularly well suited to large scale integrated circuits using complementary MOS or BiCMOS circuit technology since the entire measurement and regulating logic can be accommodated in a current-saving and space-saving manner on one chip.

The paper by Y. Koo et al.: "A Fully Integrated CMOS Frequency Synthesizer with Charge-Averaging Charge Pump and Dual-Path Loop Filter for PCS- and Cellular-CDMA Wireless Systems", Journal of Solid-State Circuits, Vol. 37, No. 5, May 2002, pp. 536–542, describes a circuit, in which the control signal for selecting the desired subbands of the VCO is tapped off at the phase detector. In this case, the edges of the reference signal and the divided-down VCO signal are counted and compared at the phase detector.

The two circuits described have the principle in common that a variable that is derived from the VCO frequency is measured and not the oscillator frequency itself. On the one hand, this is associated with the disadvantage that the VCO frequency at the phase detector has already been reduced by the divider factor n of the frequency divider, as a result of which the frequency resolution has been reduced or the measurement time required has been increased. In addition, further analog circuit blocks for signal processing are required when measuring analog variables such as the loop filter voltage. Furthermore, when the PLL is operated as a so-called fractional N frequency synthesizer, the divider factor N is varied once per reference period. The systematic error caused thereby must be taken into account in a complex manner during regulation.

Programmable dividers for high frequencies are normally always in the form of dual-modulus dividers or multi-modulus dividers for reasons of speed.

Such a programmable frequency divider is specified, for example, in the document C. S. Vaucher et al.: "A Family of Low-Power Truly Modular Programmable Dividers in Standard 0.35 μm CMOS Technology". This paper reveals that programmable radiofrequency dividers cannot be read directly.

In the document U.S. Pat. No. 5,182,528, the frequency of the oscillator is determined using a frequency counter. A microcomputer supplies the digital control signals and the analog control voltage via a complex digital/analog converter for the VCO. The document describes how a separate computer is required for the complicated driving and reading of the VCO. In addition, the circuit is not suitable as a frequency synthesizer that meets high demands in terms of the phase noise, as are required, however, for mobile radio systems such as GMS (Global System for Mobile Communication) or UTMS (Universal Mobile Telecommunication System). Furthermore, in the document described, no real phase comparison but rather merely a frequency comparison is carried out. The architectures of the other documents which have already been explained attempt to circumvent this complicated operation of reading out the high frequency at the output of the oscillator just by determining the output frequency of the VCO at the phase detector.

The document A. Kral, F. Behbahani and A. A. Abidi "RF-CMOS Oscillators With Switched Tuning" also shows a VCO having subbands which can be changed over.

The document EP 1 189 347 A1 shows a voltage-controlled oscillator having a capacitance bank. Control is effected, inter alia, using a digital signal processor having a frequency measuring device, which is connected to the VCO output via a frequency divider.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later.

The present invention is directed to a phase regulating arrangement of the generic type in such a manner that it meets high demands imposed on the phase noise, can be implemented with little effort and can be used in mobile radios.

In accordance with one embodiment of the invention, provision is made of a readable frequency counter having a counter input, which is connected to the output of the oscillator, and a count output, at which a count can be read out therefrom. Provision is also made of a control unit for controlling the tunable oscillator, that is to say for selecting the respective frequency band of the tunable oscillator. For this purpose, the control unit has an input, which is connected to the count output of the readable frequency counter, and an output, which is connected to the selection input of the tunable oscillator for selecting the frequency band.

In accordance with the invention, the frequency counter, which is configured to be readable in a manner dependent on which the frequency band of the oscillator is set, and the step-down frequency converter in the actual phase-locked loop that couples the output of the oscillator to the phase detector are in the form of separate functional blocks.

This exemplary feature makes it possible to design the step-down frequency converter to be programmable, while the frequency counter is designed to be readable.

In terms of the respective requirements, the step-down frequency converter and the frequency counter (which is designed to be readable) can advantageously be optimized independently of one another.

For the purpose of dividing the frequency, the step-down frequency converter is, in one example, in the form of a programmable counter.

In addition, the step-down frequency converter may be in the form of a so-called multi-modulus divider or at least in the form of a dual-modulus divider so that, on average over time, a fractional rational divider ratio can be set at the step-down frequency converter. This advantageously makes it possible to operate the phase regulating arrangement described as a $\Sigma\Delta$ fractional N synthesizer.

The tunable oscillator and the frequency counter (which is designed to be readable) are, in one example, integrated on the same chip. This makes it possible to use the readable frequency counter to detect the frequency of the oscillator at the output thereof in a particularly precise manner. The readable frequency counter is used in such example to evaluate each edge of the oscillator output signal.

In addition to the oscillator frequency, the same method can also be used to measure the slope of the oscillator. For this purpose, a plurality of fixed control voltages are applied to the oscillator and the respectively resultant frequencies are measured. When the tuning voltages which have been applied are known, a measure of the slope of the oscillator in the respective frequency band can be derived from said frequencies. The oscillator tuning voltage can be set, for example, by modifying the phase detector to the effect that signals having a fixed mark-space ratio are generated and are used by the loop filter to generate defined DC voltages.

In one embodiment, the frequency counter, which is designed to be readable, comprises an asynchronous binary counter having a volatile output register, a so-called latch. The latch is used to read out the count of the frequency counter.

Asynchronous binary counters can advantageously be constructed in a simple manner, for example using flip-flop chains. Asynchronous counters can also be easily implemented for high frequencies. The propagation times within the counter can be taken into account without any problems when reading out the count.

The control unit for driving the oscillator for the purpose of selecting the frequency band and the step-down frequency converter in the phase-locked loop, in one example, each have a desired input for supplying a desired frequency signal at the target frequency. Both the frequency divider ratio in the PLL and the appropriate subband of the oscillator are therefore set in a manner dependent on the desired target frequency.

The frequency counter, which is designed to be readable, in one example, has a control input for setting the frequency resolution that is connected to an assigned control output of the control unit. The counter can thus be driven for a prescribed gating time in a manner dependent on the VCO frequency and the counter reading can be read out. Selecting the gating time makes it possible, in particular when evaluating each signal edge of the oscillator output signal, to select the optimum compromise between measurement time and measurement accuracy for any desired application. The measurement accuracy depends exclusively on the gating time.

It is advantageous to use a binary counter to measure the frequency since, in this case, the counter reading is in the same format as the desired value. The desired frequency of a PLL is usually represented as a binary word in multiples of the reference frequency, as a fractional multiple in the case of fractional N PLLs. Asynchronous counters can also be easily implemented for high frequencies but in such instances any propagation times which may be present in the counter should be taken into consideration during the reading-out operation.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed.

BRIEF DESCRIPTION OF THE DRAWINGS

The invention will be explained in more detail below using a plurality of exemplary embodiments and with reference to the drawings, in which.

DETAILED DESCRIPTION OF THE INVENTION

Figure 1:
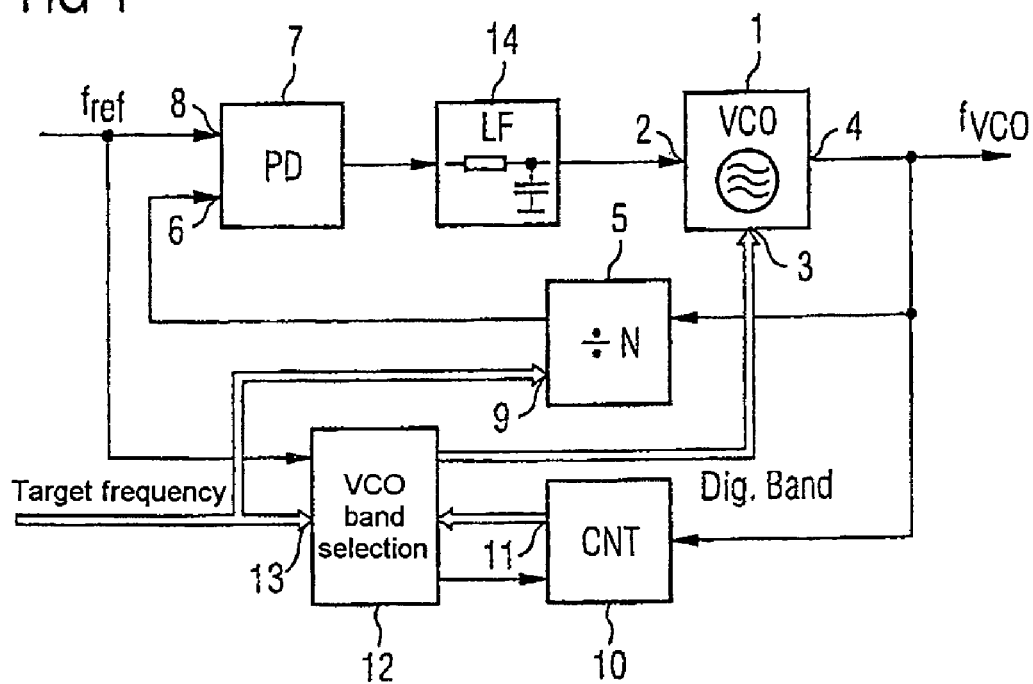
FIG. 1 is a block diagram illustrating an exemplary embodiment of the present invention.

FIG. 1 shows a phase regulating arrangement, which is in the form of a PLL (Phase-Locked Loop) and has a tunable oscillator 1 having a plurality of frequency bands which can each be tuned. The tunable oscillator 1 has a tuning input 2, a selection input 3 for selecting a frequency band in a manner dependent on a control signal and an output 4, at which a signal at the desired oscillator frequency $f_{VCO}$ can be tapped off. The output 4 of the oscillator simultaneously forms the output of the phase regulating arrangement. The output 4 of the oscillator is connected to an input 6 of a phase detector 7 via a programmable frequency divider 5, which down-converts the frequency. A reference signal at a reference frequency $f_{ref}$ is supplied to a further input 8 of the phase detector 7. In order to set the oscillator frequency $f_{VCO}$, the frequency divider 5 has a programming input 9, to which the target frequency or an item of information derived from the target frequency is supplied in the form of a desired signal.

In addition to the programmable frequency divider 5, which is in the form of a digital programmable frequency counter, provision is made of a further frequency counter 10 whose counting input is likewise connected to the output 4 of the tunable oscillator 1. In contrast to the frequency divider 5, the frequency counter 10 has a count output 11, at which the instantaneous count of the frequency counter 10 or a stored count can be read out.

The frequency divider 5 is therefore designed to be programmable but not readable and the frequency counter 10 is designed to be readable but not programmable.

A control unit 12 is used to select the frequency band at the oscillator 1 in a manner dependent on the target frequency of the phase regulating arrangement and the count of the counter 10. For this purpose, the control unit 12 has an input, which is connected to the count output 11, and an output, which is connected to the selection input 3 of the tunable oscillator 1. In addition, the control unit 12 has a control input 13. The control inputs which are intended to supply the target frequency 9, 13 and belong to the frequency divider 5 and the control unit 12 are connected to one another for the purpose of supplying the desired frequency of the phase regulating arrangement or a signal derived from said desired frequency.

The output of the phase detector 7 is coupled to the tuning input 2 of the oscillator 1 via a loop filter 14. The loop filter 14 is used to dimension the control loop of the PLL.

The control unit 12 has an input for supplying the reference frequency $f_{ref}$ that is also applied to the input 8 of the phase detector 7.

One exemplary feature of the present invention is that the VCO frequency is measured using a separate counter 10, which is directly connected to the output 4 of the oscillator 4 and is arranged on the same chip as the oscillator 1. This makes it possible to measure the oscillator frequency directly and thus in a highly precise and, at the same time, very rapid manner. The counter 10 is not programmable in one example and can therefore also be implemented, with a simple design, for high input frequencies in such a manner that the count can be read out.

Counters of this type—such as the frequency counter 10—can also be integrated without any problems for the gigahertz frequency band using modern CMOS circuit technologies, for example. Consequently, measurement and adjustment can be effected in full on the same chip without having to supply the radiofrequency oscillator signal to external measuring apparatuses. Since the separate counter 10 runs in parallel with the actual phase regulating arrangement 1, 5, 7, 14, it is also not necessary to use a prescaler or phase detector to intervene in performance-critical functional blocks of the PLL such as the frequency divider. The target frequency and the actual frequency can be compared in a particularly simple manner in the control unit 12 if the gating time is derived from the reference period. The actual algorithm that is used to set or regulate the frequency band of the oscillator in a manner dependent on the counter reading of the counter 10 is not linked to the measurement method and can be selected independently of the measurement method depending on the requirement.

The counter 10 is driven at the oscillator frequency $f_{VCO}$ for a prescribed gating time $\Delta T_{Gate}$ and the counter reading CNT is read out. This is effected in accordance with the rule:

$$f_{vco} = \frac{CNT}{\Delta T_{Gate}}.$$

Since each edge of the oscillator 1 is evaluated, an optimum compromise between measurement time and measurement accuracy can be found for any application of the phase regulating arrangement described by selecting the gating time $\Delta T_{Gate}$. The measurement accuracy is exclusively determined by the gating time.

The measurement inaccuracy $\Delta f$ results in accordance with the formula:

$$\Delta f = \frac{1}{\Delta T_{Gate}}$$

If the gating time is derived from the reference period, that is to say is determined in a manner dependent on the reference frequency $f_{ref}$, the count can be compared with the target frequency in a simple manner. In this case, the frequency divider 5 may also be in the form of a fractional N divider.

The phase regulating arrangement described also makes it possible to measure the respective VCO slope by successively setting the VCO frequency using two or more different fixed control voltages at the tuning input 2 and measuring the resultant respective frequencies. A measure of the slope of the VCO in the respective frequency band can be derived from these frequency values.

The described digital regulation of the appropriate subfrequency band is therefore effected very rapidly and with a short actuating time using the present invention. This is advantageous, in particular, when used in systems which operate using time-division multiplexing such as, for example, GSM since, in that case, the frequency is intended to reach a new value very quickly between the time slots.

Depending on the requirement, the oscillator may comprise a few or else several thousand subbands. The proposed regulating system operates accurately enough to find the correct subband of the VCO that comprises the desired target frequency. The present regulating system is robust enough to find the correct band even when the change in frequency does not run in an ideally linear or monotonic manner over the digital control word.

Since, on account of the multiplicity of subbands which can be set, a gentle slope is provided in the oscillator, the high demands of mobile radio standards imposed on the phase noise can be met without any problems. The high measurement resolution required on account of the large number of bands is ensured without any problems, in conjunction with short measurement times at the same time, using the readable counter 10.

Since, as already described, the slope of the VCO can also be determined and, if necessary, corrected, any possible effects of the slope on the loop gain and/or loop bandwidth can also advantageously be taken into account.

In the present case, the desired and actual values of the frequency are compared using a digital comparator of desired and actual values. Alternatively, however, the desired and actual values may also be subtracted. It is likewise possible to check the sign bit of a down-counter, which is loaded with the count for the desired frequency.

In the present exemplary embodiment, the control unit 12 is designed to set the respective correct frequency band using the successive approximation method. In this case, the approximation is effected depending on whether the actual frequency is greater than or less than the target frequency. Depending on the comparison result, the oscillator frequency is digitally corrected. This principle also advantageously works in the case of highly variable nonlinear oscillator frequency characteristics. The number of iteration steps is calculated from the logarithm to the base of two of the total number of VCO subbands.

As an alternative to successive approximation, a table, which is used to determine the correct band from the frequency deviation of the oscillator, could be stored in the control unit 12.

An algorithm that calculates the correct band from the frequency deviation of the VCOs provides another possible way of determining the oscillator band.

In addition, use could alternatively also be made of a counting method or successive approximation method, this method increasing or reducing the oscillator word by 1 depending on whether the actual frequency is greater than or less than the target frequency. This method also works in the case of a highly variable nonlinear VCO frequency characteristic. As many iterations as the oscillator has subbands are required at most. This method can be implemented in a particularly simple manner.

Figure 2:
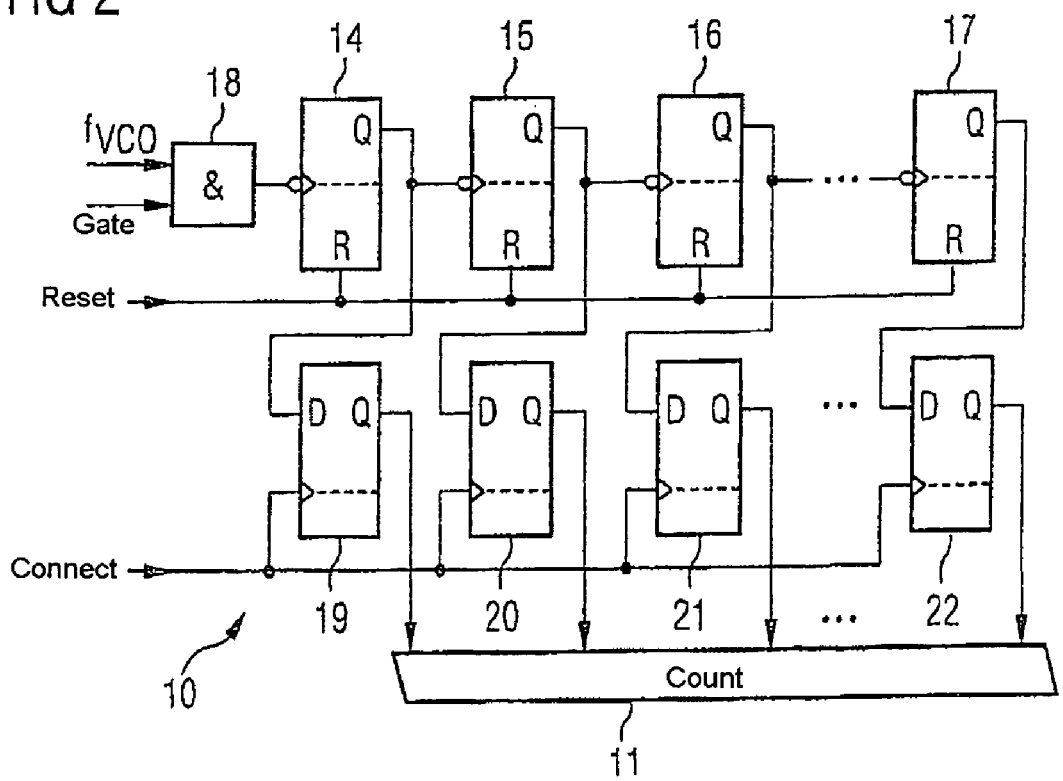
FIG. 2 is a schematic diagram illustrating an exemplary embodiment of a readable frequency counter for use in the phase regulating arrangement of FIG. 1.

FIG. 2 shows an asynchronous binary counter 10 as can be used in the phase regulating arrangement shown in FIG. 1. The asynchronous binary counter comprises a plurality of flip-flops 14, 15, 16, 17 which are connected in series and each have a clock input, a reset input R and an output Q. The clock input of the input-side flip-flop 14 is connected to the output of an AND gate 18 whose inputs are connected, on the one hand, to the output 4 of the oscillator 1 and, on the other hand, to a control output of the control unit 12 for controlling the gating time. The clock inputs of the downstream flip-flops 15, 16, 17 are each connected to the output Q of the flip-flop 14, 15, 16 that is connected upstream. The reset inputs R are connected to one another and to a reset input of the counter 10, which is likewise connected to a control output of the control unit 12. Each flip-flop 14, 15, 16, 17 is assigned a D-type flip-flop 19, 20, 21, 22, which operates as a latch and is connected, by way of its data input, to the output Q of the counting flip-flop 14, 15, 16, 17. The clock inputs of the D-type flip-flops 19 to 22 are connected to a connection input, which is connected to a control output of the control unit 12 and switches through the instantaneous count to the output 11 of the counter. For this purpose, the outputs Q of the D-type flip-flops 19 to 22 are connected to the count output 11.

The comparison of the desired and actual frequencies in the control unit 12 becomes particularly simple if the gating time for the counter 10 is a power of two $2^k$ of the reference period; the following then applies to the counter reading CNT:

$$CNT = f_{vco} \cdot T_{Gate} = f_{vco} \cdot 2^k \cdot T_{ref} = 2^k \cdot \frac{f_{vco}}{f_{ref}}$$

The counter reading CNT thus corresponds to the ratio between the VCO frequency and the reference frequency, which ratio has been shifted k bits to the left. If the VCO 1 oscillates at precisely the target frequency, the quotient of the oscillator frequency and the reference frequency is equal to N, that is to say is equal to the programmed divider value. In order to compare the desired and actual frequencies, in the case of the gating time that corresponds to the product of $2^k$ and the reference period duration $T_{ref}$, the counter reading CNT can therefore be compared with the divider value N that has been shifted k bits to the left, in accordance with the rule CNT=$2^k$*N.

In the case of integer divider values, k zeros must be added to the less significant bits of the divider value. In the case of fractional N divider values, the corresponding number of decimal places must be added. The frequency inaccuracy $\Delta f$ is:

$$\Delta f = \frac{1}{T_{Gate}} = \frac{f_{ref}}{2^k}.$$

In the case of integrated circuits, external adjusting elements or additional process steps are normally dispensed with for reasons of cost. The frequency-determining components are therefore normally exposed to severe process and temperature fluctuations and it is not possible to use an adjustment algorithm that has permanently programmed in the frequency characteristic of the oscillator, so-called lookup tables or the like. In contrast thereto, the successive approximation algorithm that may be used in the present invention merely requires the frequency against band characteristic of the VCO not to have any missing frequency bands. However, monotony disturbances or nonlinearities are not problematical.

Figure 3:
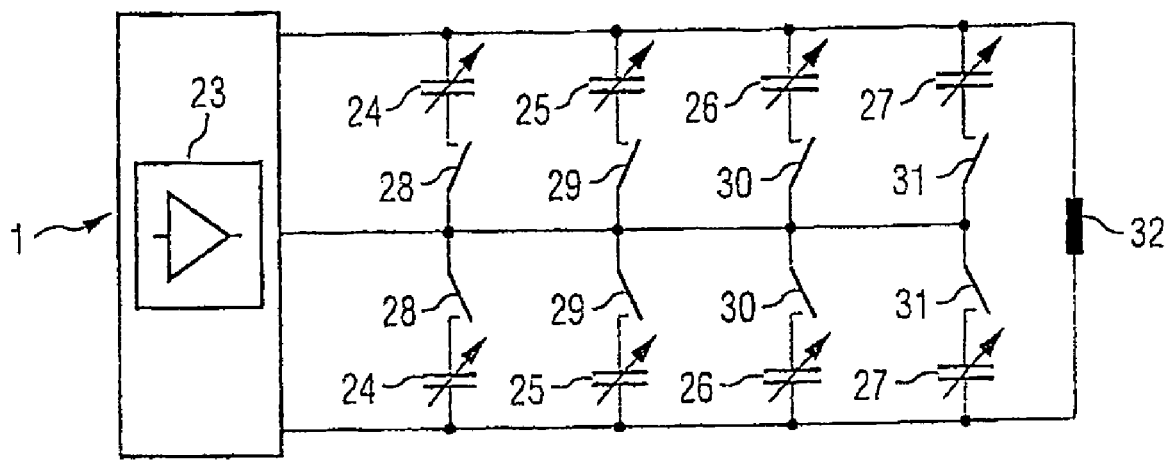
FIG. 3 is a schematic diagram illustrating an exemplary embodiment of a tunable oscillator having a plurality of subfrequency bands which can each be tuned for use in the phase regulating arrangement of FIG. 1.

FIG. 3 shows an exemplary embodiment of a multiband oscillator 1 as can be used in FIG. 1. The oscillator is in the form of an LC oscillator, which means that inductances 32 and capacitances 24, 25, 26, 27 are provided as elements which determine the oscillation frequency. Provision is additionally made of a deattenuation amplifier 23, which, as an active element, ensures that a negative impedance is provided. A multiplicity of tunable capacitance pairs 24, 25, 26, 27 are connected in parallel with said deattentuation amplifier, the capacitances each being provided twice and being arranged in series with switches 28, 29, 30, 31. These series circuits comprising varactors and switches are connected in parallel with one another. An inductance 32 is also connected in parallel with said parallel circuit. Supply and reference potential terminals are not depicted for the purpose of simplification. The varactors 24 to 27 and switches 28 to 31 may, for example, all be of the same size and/or may be graduated in a binary manner or in another variable fashion, as may be desired. Activating respective switches and thus respective varactors makes it possible to select the frequency band in the desired manner. The switches 28 to 31 are driven using the control unit 12 of FIG. 1.

Figure 4:
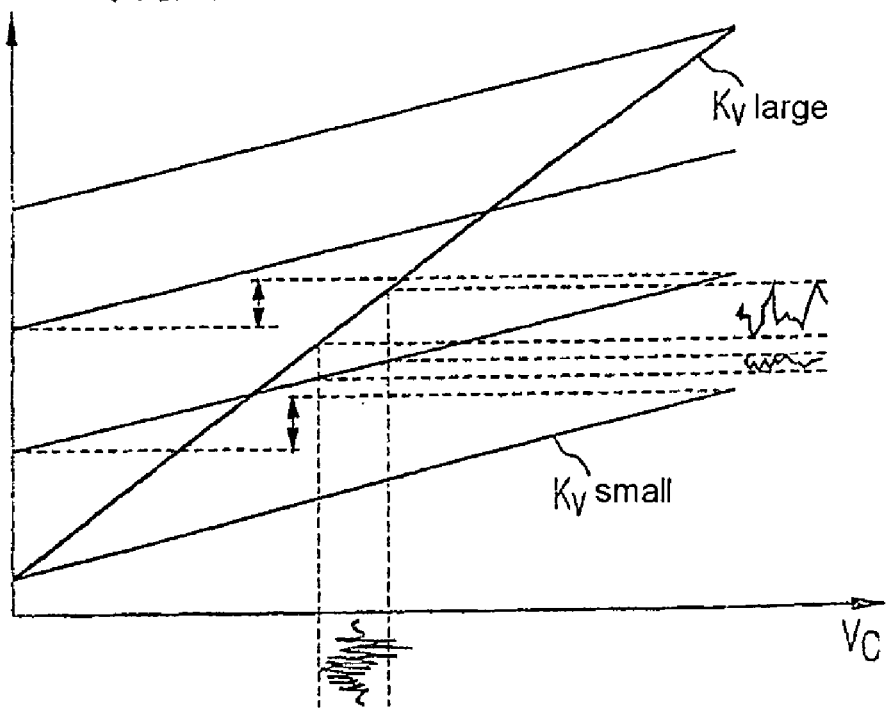
FIG. 4 is a graph illustrating the tuning characteristic of the oscillator of FIG. 3 having a plurality of frequency bands.

FIG. 4 describes the characteristic of the oscillator 1 of FIG. 3. In this case, the frequency is plotted against the tuning voltage in a graph. $K_V$large is used to denote the characteristic curve of a VCO that only has precisely one tunable frequency band. It can clearly be seen that a relatively steep slope is provided in order to be able to cover the entire frequency band. If, however, four subbands are selected (as shown in FIG. 3), which subbands can be used to cover the same frequency band and overlap one another slightly so that there are no missing frequency bands, it can be seen that the slope $K_V$small can advantageously be much more gentle and the oscillator thus has very much less phase noise.

Figure 5:
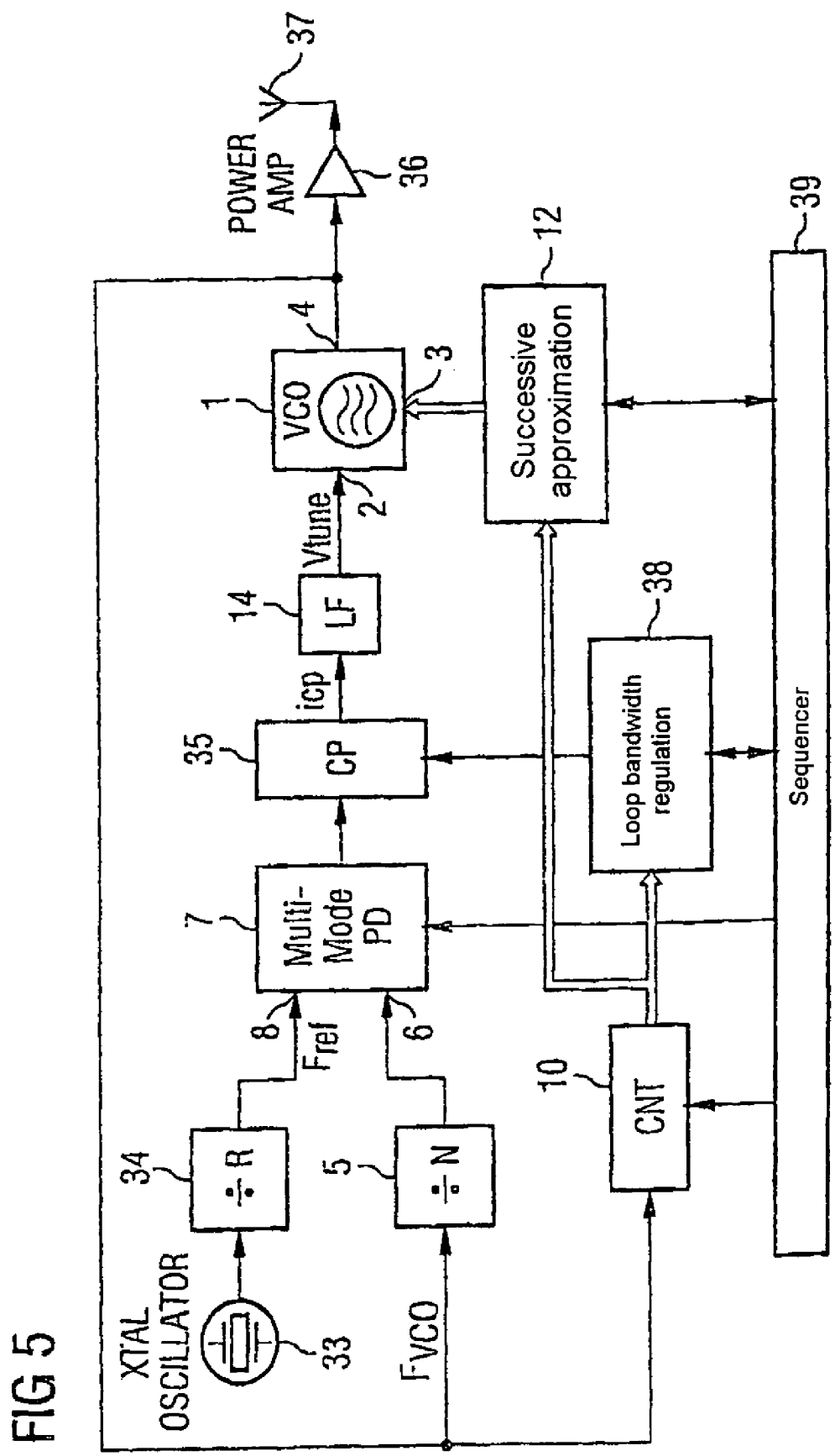
FIG. 5 is a block diagram illustrating a development of the phase regulating arrangement of FIG. 1 having loop bandwidth regulation.

FIG. 5 shows a development of the phase regulating arrangement of FIG. 1, in which loop bandwidth regulation is additionally provided. The circuit of FIG. 5 largely corresponds to that of FIG. 1 and is not described again in this respect at this juncture. A crystal oscillator 33, which is connected to the input 8 of the phase detector 7 via a reference frequency divider 34 for providing the reference frequency $f_{ref}$, is additionally provided in FIG. 5 at the input 8 of the phase detector 7. In the present case, the phase detector 7 is connected to the input of the loop filter 14 via a charge pump circuit 35. The output 4 of the phase regulating arrangement is connected to an antenna 37 via a power amplifier 36. The output of the frequency counter 10, which is designed to read out the count, is not only connected to an input of the control unit 12 but also to a loop bandwidth regulating block 38, which is connected to the charge pump 35 in order to control the latter. The counter 10, the phase detector 7, the loop bandwidth regulating block 38 and the control unit 12 are coupled, in a partially bidirectional manner, to a sequence controller 39.

The oscillator frequency is measured in a highly precise and rapid manner in order to regulate the loop bandwidth, with the result that said loop bandwidth regulation can be added, with little outlay, to the circuit of FIG. 1. The loop bandwidth regulation proposed can be used to easily compensate for any different slope (which may be present) of the oscillator in the various frequency bands.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

The invention claimed is:

1. A phase regulating circuit, comprising:
   a tunable oscillator comprising a tuning input, and configured to generate an output signal in one of a plurality of frequency bands, and a selection input configured to receive a control signal indicative of a desired frequency band;
   a phase detector comprising a first input configured to receive a reference signal, and comprising a second input coupled to an output of the oscillator via a step-down frequency converter;
   a frequency counter comprising a counter input directly connected to the output of the oscillator, and a count output, and configured to generate a count thereat, wherein the frequency counter comprises an asynchronous binary counter comprising a volatile output register; and
   a control unit comprising an input connected to the count output, and comprising an output connected to the selection input of the tunable oscillator.

2. The phase regulating circuit of claim 1, wherein the step-down frequency converter comprises a programmable counter.

3. The phase regulating circuit of claim 1, wherein the step-down frequency converter comprises a multi-modulus divider configured to set, on average, a fractional rational divider ratio.

4. The phase regulating circuit of claim 1, wherein the tunable oscillator and the frequency counter are integrated on a common semiconductor body.

5. The phase regulating circuit of claim 1, wherein the control unit and the step-down frequency converter each comprise an input for receiving a target frequency signal, and wherein the control unit is configured to selectively alter the control signal based on the count of the target frequency signal.

6. The phase regulating circuit of claim 1, wherein the frequency counter comprises a control input for setting a frequency resolution thereof, wherein the control input is connected to a control output of the control unit.

7. A phase locked loop, comprising:
a voltage controlled oscillator configured to generate an output signal in one of a plurality of frequency bands based on a state of a selection signal supplied thereto, and further configured to adjust a frequency of the output signal within a given frequency band based on a state of a tuning control signal supplied thereto;
a phase detector configured to generate a signal associated with the tuning control signal based on a comparison between a reference signal and a divided down feedback signal;
a programmable divider circuit configured to receive the output signal from the voltage controlled oscillator and generate the divided down feedback signal in response thereto, wherein the divided down feedback signal comprises the output signal divided by a value dictated by a target frequency value supplied thereto;
a counter directly coupled to the voltage controlled oscillator to receive the output signal from the voltage controlled oscillator and generate a count associated therewith wherein the counter comprises an asynchronous binary counter comprising a volatile output register; and
a control circuit configured to generate the selection signal based on the count from the counter and the target frequency value.

8. The phase locked loop of claim 7, further comprising a loop filter configured to receive the signal from the phase detector and generate the tuning control signal in response thereto.

9. The phase locked loop circuit of claim 7, wherein the count generated by the counter is a function of the output signal from the voltage controlled oscillator and a control gate time period provided by the control circuit.

10. The phase locked loop circuit of claim 7, wherein the counter comprises an asynchronous binary counter.

11. The phase locked loop circuit of claim 10, wherein the asynchronous binary counter further comprises a volatile output register.

12. The phase locked loop circuit of claim 7, wherein the voltage controlled oscillator comprises a plurality of capacitors selectively coupled in parallel with an inductance, wherein a number of capacitors coupled thereto dictates the frequency band of the voltage controlled oscillator.

13. The phase locked loop circuit of claim 7, wherein the counter comprises a control input for setting a frequency resolution thereof, wherein the control input is connected to a control output of the control circuit.

* * * * *